(12) United States Patent
Ruske et al.

(10) Patent No.: US 11,506,363 B2
(45) Date of Patent: Nov. 22, 2022

(54) ULTRATHIN OLED LIGHTING PANEL

(71) Applicant: OLEDWorks GmbH, Aachen (DE)

(72) Inventors: Manfred Ruske, Kerpen (DE); Konrad Sell, Aachen (DE); Thomas Hoegen, Niederzier (DE); Joerg Knipping, Wegberg (DE)

(73) Assignee: OLEDWORKS LLC, Rochester, NY (US)

( * ) Notice: Subject to any disclaimer, the term of this patent is extended or adjusted under 35 U.S.C. 154(b) by 252 days.

(21) Appl. No.: 16/954,933

(22) PCT Filed: Jan. 9, 2019

(86) PCT No.: PCT/EP2019/050407
§ 371 (c)(1),
(2) Date: Jun. 17, 2020

(87) PCT Pub. No.: WO2019/137941
PCT Pub. Date: Jul. 18, 2019

(65) Prior Publication Data
US 2020/0378582 A1    Dec. 3, 2020

Related U.S. Application Data

(60) Provisional application No. 62/615,135, filed on Jan. 9, 2018.

(51) Int. Cl.
*F21V 19/00*    (2006.01)
*F21V 15/01*    (2006.01)
(Continued)

(52) U.S. Cl.
CPC ............ *F21V 19/003* (2013.01); *F21V 15/01* (2013.01); *H01L 51/5012* (2013.01);
(Continued)

(58) Field of Classification Search
CPC ....... F21V 19/003; F21V 15/01; H05K 1/028; H05K 1/189; H05K 2201/10128;
(Continued)

(56) References Cited

U.S. PATENT DOCUMENTS 5,162,696 A * 11/1992 Goodrich ................ G09F 9/301
313/511
6,565,231 B1    5/2003 Cok
(Continued)

FOREIGN PATENT DOCUMENTS

EP    3226321 A1    10/2017
JP    6-223972    8/1994
(Continued)

OTHER PUBLICATIONS

Office Action Received for European Patent Application No. 19700363.5, dated Aug. 4, 2021, 7 pages (filed as non-patent literature attachment).

*Primary Examiner* — Anne M Hines
*Assistant Examiner* — Jose M Diaz

(57) ABSTRACT

A flexible lighting panel comprising a light-emitting unit with electrical contact pads on a flexible substrate; a flat flexible printed circuit board with a bendable extension tab, wherein the circuit board is located on the opposite side of the light-emitting unit from the substrate; the area of the circuit board, not including the extension tab, is the same or greater than and overlaps the emissive area of the light-emitting unit; and the circuit board has at least two flat electrical connectors in electrical contact with the contact pads of the light-emitting unit; the flat electrical connectors extending along the extension tab of the circuit board for connection to a power source. The light emitting unit can be an OLED. The extension tab can be bent so that the flat
(Continued)

electrical connections become accessible in different orientations. The panel can be ultrathin.

15 Claims, 11 Drawing Sheets

(51) Int. Cl.
  *H01L 51/50* (2006.01)
  *H01L 51/52* (2006.01)
  *H05K 1/02* (2006.01)
  *H05K 1/18* (2006.01)
  *F21Y 115/15* (2016.01)

(52) U.S. Cl.
  CPC ......... *H01L 51/5203* (2013.01); *H05K 1/028* (2013.01); *H05K 1/189* (2013.01); *F21Y 2115/15* (2016.08); *H01L 2251/5338* (2013.01); *H01L 2251/5361* (2013.01); *H05K 2201/10128* (2013.01)

(58) Field of Classification Search
  CPC ............ H05K 2201/05; F21Y 2115/15; H01L 51/5012; H01L 51/5203; H01L 2251/5338; H01L 2251/5361; Y02B 20/30
  See application file for complete search history.

(56) References Cited

U.S. PATENT DOCUMENTS

| | | |
|---|---|---|
| 6,787,990 B2 | 9/2004 | Cok |
| 8,430,530 B2* | 4/2013 | Aurongzeb ............. F21V 14/02 |
| | | 362/249.03 |
| 8,492,969 B2 | 7/2013 | Lee et al. |
| 9,035,290 B2 | 5/2015 | You et al. |
| 9,148,497 B2 | 9/2015 | Penttila et al. |
| 9,647,052 B2 | 5/2017 | Youn et al. |
| 11,118,742 B2* | 9/2021 | Hamer ..................... F21V 21/30 |
| 2004/0160166 A1* | 8/2004 | Cok ......................... F21S 6/002 |
| | | 313/506 |
| 2010/0327737 A1 | 12/2010 | Hayashi et al. |
| 2013/0026513 A1 | 1/2013 | Aurongzeb et al. |
| 2017/0111993 A1 | 4/2017 | Lang et al. |

FOREIGN PATENT DOCUMENTS

| | | |
|---|---|---|
| WO | 2016/093475 A1 | 6/2016 |
| WO | 2016/093476 A1 | 6/2016 |
| WO | 2016/093483 A1 | 6/2016 |
| WO | 2016/099025 A1 | 6/2016 |

* cited by examiner

ULTRATHIN OLED LIGHTING PANEL

CROSS REFERENCE TO RELATED APPLICATIONS

This application claims the benefit of U.S. Provisional Application No. 62/615,135, filed Jan. 9, 2018. Reference is also made to co-filed and commonly assigned (PCT International Application number PCT/EP2019/050399), entitled 'THIN OLED LIGHTING MODULE".

BACKGROUND

OLED lighting panels, which rely on OLED technology to generate light, offer many advantages for general lighting purposes. They are efficient in terms of light output for power consumed. They are low voltage which helps avoid potential electrical shocks, less prone to sparking in potentially explosive environments, and they reduce loads in the supporting electrical system. The spectrum of emitted light can be varied using appropriate internal designs. They produce little or no UV or IR light. They are instant on; that is, they emit light immediately whenever electrical power is supplied. OLED light sources are inherently flat area light sources. They offer several advantages over LED lighting panels. They can be made even thinner (for example, less than 1 mm thick) and they produce less heat under normal operating conditions. However, OLED lifetimes can be an issue. Both LED and OLED lighting panels can be made on flexible or curved substrates even though OLED is preferred for these types of applications. In summary, OLED lighting panels can be useful as lighting panels. They are efficient, low voltage, cool to the touch, and are thin. Luminaires (a complete unit with a light source (i.e. a lamp) and a supporting part (i.e. a lamp-holder) that provides light and illumination) can be designed to utilize OLED lighting panels.

In the lighting industry, luminaire design is often of critical importance. Besides addressing general or specific illumination needs, luminaires become part of the architectural environment. It would be very desirable to design luminaires that take advantage of some of the unique physical characteristics of OLEDs that differ from other light sources such as LED. In particular, OLED lighting panels can be thinner and more flexible than LED lighting panels.

Generally speaking, an OLED panel for use in a luminaire would have at least three parts: a substrate or support, an OLED light-emitting unit, and electrical connections which provide power to the internal OLED electrodes from an external source. An OLED light-emitting unit would have at least one organic electroluminescent layer between two electrodes on a substrate and would be encapsulated to protect the electroluminescent layer(s) from air and/or water.

Typically, the OLED panel would have emissive areas surrounded by non-emitting borders. Electrode contact pads, which are connected to the internal electrodes, are often located in these non-emitting border areas on the same face of the substrate as the electroluminescent layers. However, the need to provide the OLED light-emitting unit with mechanical support and electrical power from an external source often leads to panels that are thicker than desired for design purposes.

OLED light-emitting units can be prepared on either rigid or flexible substrates. While both can be very thin, flexible substrates are advantaged since they can be used in curved or bent designs as well as in rigid (flat or curved) applications when further supported by an inflexible housing or mounting.

However, some panel applications require electrical connections that are not on the same surface of the substrate as the OLED light-emitting unit. For example, some applications might require electrical connections to be made from the edge of the device as opposed to one of the flat faces. Other applications might require electrical connections to be made from the opposite face of the OLED unit from the substrate as opposed to the same face as the OLED unit. These types of applications can lead to an increase in thickness of the panel. Moreover, it can also require more complicated manufacturing processes since different manufacturing processes must be used for different designs It would be desirable to design a flexible OLED lighting panel that is as thin as possible and that allows for electrical connections to a power source to be made in different configurations. Such a design would have aesthetic appeal in many applications and can be easily adapted for particular usages.

JP06-223972 describes an OLED lighting panel with electrode leads on the emitting side which are bent over the edge of the panel in order to make contact with pads on the backside of the device. However, such leads would need to be thick in order to be bent and without any support, and would be prone to displacement and short-circuiting when the panel is assembled into a holder.

U.S. Pat. Nos. 6,565,231 and 6,787,990 describe the use of an OLED in a housing with an extension tab with electrical connectors that fit into a socket for mechanical substrate and electrical connection. The tab is not flexible. U.S. Pat. No. 9,647,052 describes an OLED with a hinge allowance section with embedded wire traces where the substrate is folded back upon itself. Similar OLEDs are described in EP3231013, EP3231014, EP3231015 and EP3235001.

U.S. Pat. No. 9,035,290 describes an OLED with a flexible printed circuit board which is attached to a control circuit on one end and is folded over and around an edge of the substrate. EP3226321 describes the use of a flexible printed circuit board in an OLED. U.S. Pat. Nos. 8,492,969 and 9,148,497 describe the use of a flexible printed circuit board to connect control circuit chips located on the back of the substrate to the light-emitting elements. All of these references are directed to OLED displays.

SUMMARY

A flexible lighting panel with an emissive face and an opposite face comprising a light-emitting unit comprising at least one electroluminescent layer between a first and a second electrode on a flexible substrate forming an emissive area, the light emitting unit having at least two electrical contact pads, each individually in contact with the first or second electrode and located in a non-emissive area of the substrate; at least one flat flexible printed circuit board with at least one bendable extension tab, wherein the circuit board is located on the opposite side of the light-emitting unit from the substrate; the area of the circuit board, not including the extension tab, is the same or greater than and overlaps the emissive area of the light-emitting unit; and the circuit board has at least two flat electrical connectors on the surface of the circuit board facing the light-emitting unit and in electrical contact with the contact pads of the light-emitting unit; the flat electrical connectors extending along the extension tab of the circuit board for connection to a power source.

The lighting panel has three modes of operation: a first mode where the bendable extension tab is not bent so that electrical power can be supplied to the flat electrical connectors on the emissive face; a second mode where the extension tab is partly bent and orientated so that the flat electrical connectors are accessible along the edge of the panel; and a third mode where the extension tab is fully folded back upon the circuit board so the flat electrical connectors are accessible along the opposite face of the panel as well as the edge of the panel. The bendable extension tab can be less in width than the edge of the circuit board.

The flat electrical connectors on the bendable extension tab can be patterned such that a single portion of one of the flat electrical connectors is located between two interconnected portions of the other flat electrical connector. In particular, the extension tab is located along the edge of the panel such that the center of the space between the single portion of one flat connector and one of the interconnected portions of the other flat connector lies along the midpoint of the edge of the panel.

The flat electrical connectors can be at least 65% or more or the area of the circuit board. Moreover, the circuit board is larger in area than the substrate so part of the circuit board overhangs the outside edge of the substrate. The circuit board may comprise a plastic or polymer carrier with an overall thickness of no more than 0.015 mm.

There can be a flexible light management unit on the emissive face of the lighting panel which completely covers and is the same or greater in area than the emissive area. In some embodiments, the flexible light management unit is larger in area than the substrate so part of the light management unit overhangs the outside edge of the substrate.

If both the light management unit and the circuit board have parts that overhang the substrate, the overhanging parts may be joined together by adhesive or mechanical force.

Ideally, the light-emitting unit is an OLED, the substrate is transparent and light is emitted through the substrate.

The above features provide an ultrathin and flexible lighting panel with, depending on the configuration, three modes of electrical connection, which is simple to manufacture.

Because the structures involved are very small, the Figures are illustrative only and are not drawn to scale.

DETAILED DESCRIPTION

In the following, the example panel structures are all shown as being rectangular in shape and length and so, references are made to length and width. However, the panels are not limited to any particular shape and so, may be square, circular, oval, triangular or an irregular shape. In any case, the panel structures will all have outside edges and so, for shapes other than square or rectangular, corresponding dimensions (for example, radius for circular panels) should be applied. Rectangular or square panels are preferred. In addition, although the examples refer to using an OLED as a specific example of a light-emitting unit, any kind of light-emitting unit containing organic material would be generally useful. By "flat", it is meant that the thickness dimension is much less (generally less than 1:100) than the length and/or width dimensions. Note that "flat" refers only to the ratio of thickness to the other two dimensions; thus a "flat" plane can have a bent or curved shape. By "ultrathin", it is meant that the panel is no more than 0.7 mm thick, and desirably 0.5 mm or less.

Figure 1A:
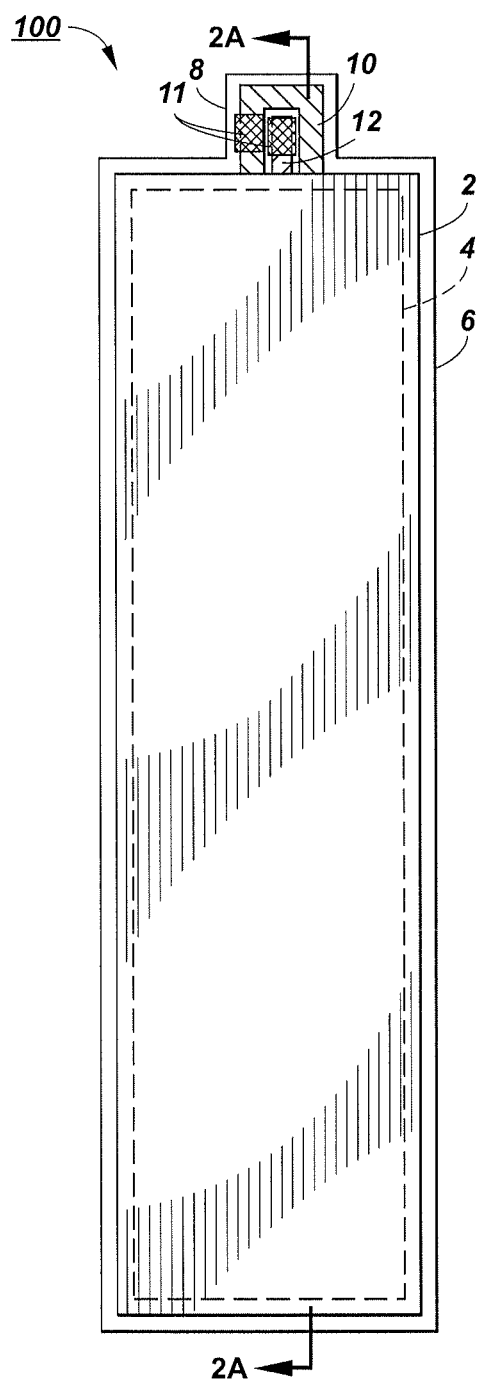
FIG. 1A is an overhead view of the emissive face of one embodiment of the lighting panel.
Figure 1B:
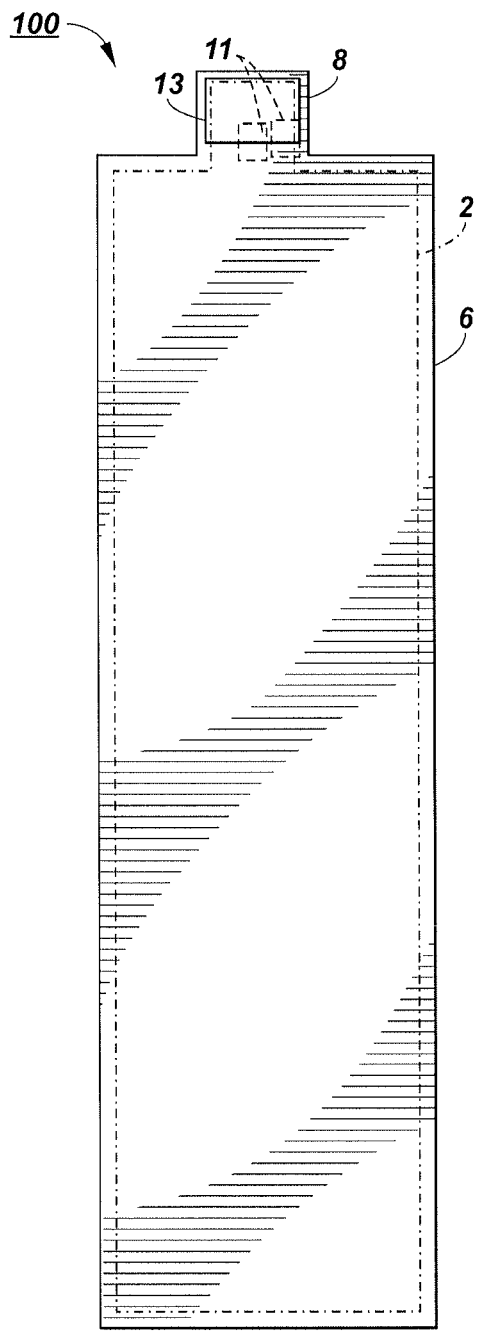
FIG. 1B is a view of the non-emissive face of the same lighting panel.

FIGS. 1A and 1B are overhead views of one embodiment of a lighting panel of the invention. FIG. 1A shows the emissive face of a lighting panel 100 where the front surface is an optional flexible light management unit 2. Underneath the light management unit 2 is the flexible light-emitting unit/substrate 4, also called OLED unit/substrate 4 in some embodiments. The light-emitting unit is arranged on the substrate such that light is transmitted through the light management unit 2. Underneath 4 is a flat flexible printed circuit board 6 which has a bendable extension tab 8 on which there are two flat electrical connectors 10, 12. The flat electrical connectors 10, 12 are in electrical contact with the first and second electrodes of the light-emitting unit. Also shown are two optional electrical contact pads 11; one in electrical contact with 10 and the other in electrical contact with 12. FIG. 1B shows the non-emissive face of panel 100. An optional stiffener 13 is attached to the back of the extension tab 8. In FIGS. 1A and 1B, the extension tab 8 is shown in an unbent configuration where the external electrical connectors 10, 12 are facing in the same direction as the light emission.

Figure 2A:
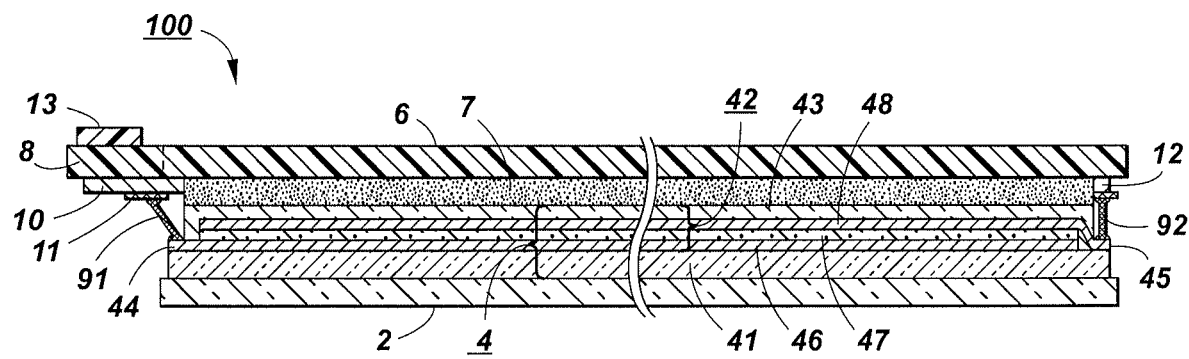
FIG. 2A is a cross-section of the lighting panel of the embodiment shown in FIG. 1A where the extension tab is in an unbent configuration.
Figure 2B:
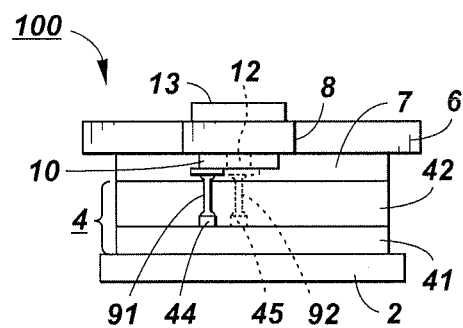
FIG. 2B is a heads-on view of the extension tab.

FIG. 2A shows a cross-section of a lighting panel 100 along line 2A as shown in FIG. 1A. 2 is a flexible light management unit. The light-emitting unit/substrate 4 of FIG. 1A comprises a flexible transparent substrate 41, the OLED light-emitting unit 42 (compromising first electrode 46, organic layer(s) 47, second electrode 48, and encapsulation 43), and two contact pads 44 and 45 of opposite polarities that are electrically connected to the first and second electrodes of the OLED light-emitting unit 42. The light-emitting unit 42 is arranged so that it transmits the light through the substrate 41 and through the light management unit 2. In this embodiment, the light-emitting unit 42 is located on the opposite face of the substrate 41 from the light management unit 2. The contact pads 44 and 45 are located outside the encapsulation 43 and are on the same face of the substrate 41 as the light-emitting unit 42 and located in a non-emitting area of the substrate. Over the light-emitting unit/substrate 4 is an optional adhesive layer 7. The optional layer attaches the overlying circuit board 6 to the underlying light-emitting unit/substrate 4. The flexible printed circuit board 6 has an extension tab 8 with flat electrical connectors 10, 12. Each of these flat connectors 10, 12 on the circuit board 6 is separately connected to one of the contact pads 44. and 45 via electrical connectors 91 and 92. The flat electrical connectors 10 and 12 are located on the face of the circuit board 6 facing the light-emitting unit/substrate 4 and face in the direction of light emission (in this embodiment). There is a stiffener 13 on the backside of the extension tab 8 of the circuit board 6. Not shown are the contact pads 11. FIG. 2B shows a heads-on side view of the unbent extension tab 8 of light-emitting lighting unit 100. In this embodiment, flat electrical connector 10 is connected to one of the OLED contact pads through 91 and flat electrical connector 12 (hidden in this view) is connected to the other contact pad through 92.

Figure 3A:
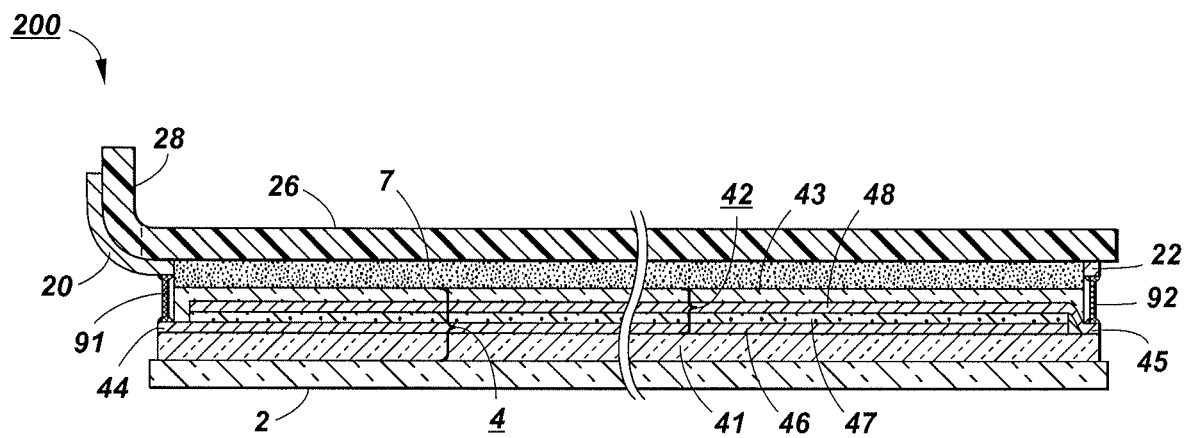
FIG. 3A is a cross-section of a lighting panel where the extension tab is bent at a right angle.
Figure 3B:
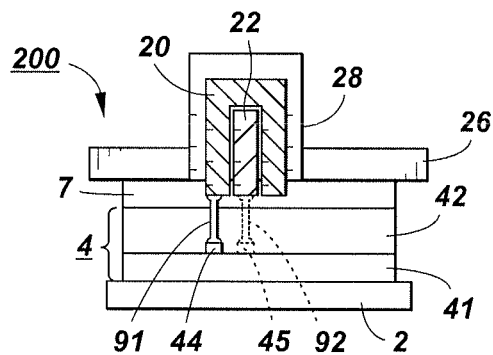
FIG. 3B is an end view of the bent extension tab.

FIG. 3A is a cross-sectional view of a lighting panel 200 which is similar to lighting panel 100 except that the extension tab 28 is bent at 90 degrees. The flat electrical contacts 20, 22 on the surface of the extension tab are also bent. The bending of the extension tab 28 allows for electrical contact from a power source to be made to the flat electrical contacts 20, 22 in a direction perpendicular to the direction of light emission, that is, from the edge of the lighting panel 200. FIG. 3B is a heads-on side view of the bent extension tab 28 of the lighting panel 200. 26 is the side edge of the circuit board. Not shown are the contact pads 11.

Figure 4A:
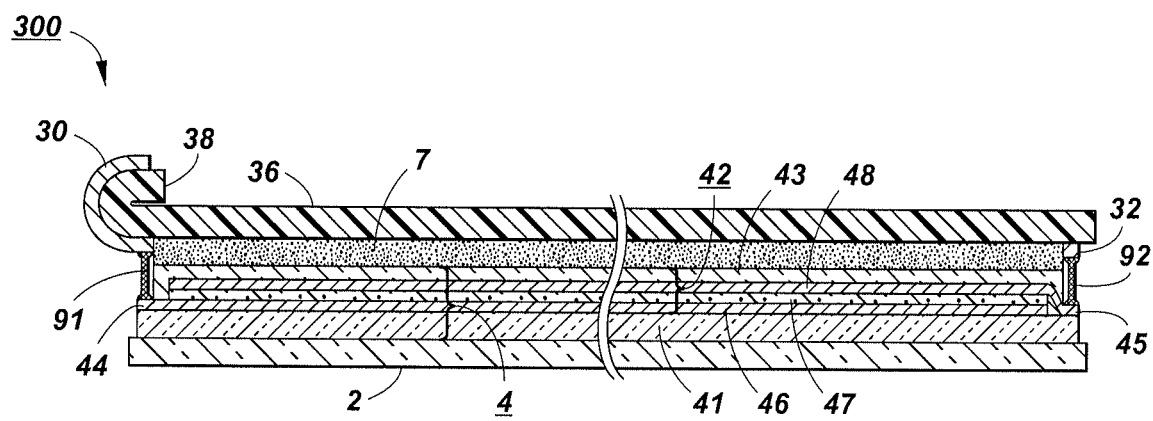
FIG. 4A is a cross-section of a lighting panel where the extension tab is folded back upon the circuit board.
Figure 4B:
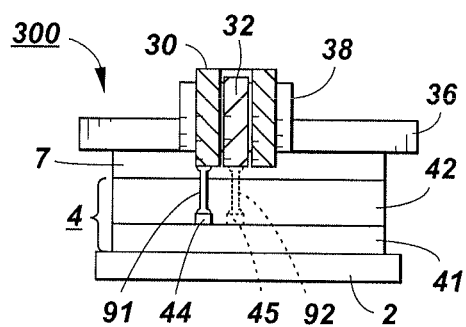
FIG. 4B is an end view of the extension tab.
Figure 4C:
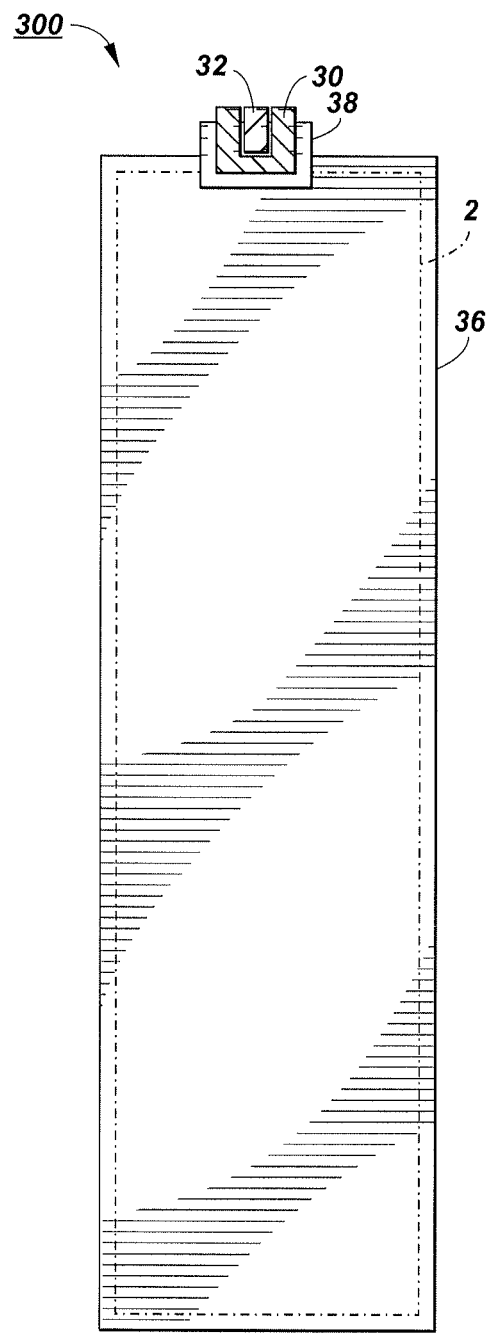
FIG. 4C is an overhead view of the back of the panel.

FIG. 4A is a cross-sectional view of OLED lighting panel 300 which is similar to lighting panel 100 except the extension tab 38 is completely bent back so that the back of the extension tab 38 (that is, the face opposite the flat electrical connectors) lies along the back face of the circuit board 36. The folding back over itself allows for electrical contact from a power source to made to the flat electrical contacts 30, 32 in either a direction perpendicular to the direction of light emission (the edge of the light panel 300) or a direction opposite to that of the light emission (the non-emissive back face of the panel 300). FIG. 4B is a heads-on side view of the folded back extension tab 38 of OLED lighting panel 300.36 is the side edge of the circuit board. FIG. 4C is an overhead view of the back face of the panel 300 showing the folded back extension tab 38. Not shown are the contact pads 11 or stiffener 13.

Figure 5A:
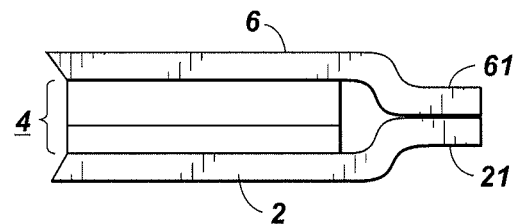
FIG. 5A is a cross-section view illustrating the portions of the light management unit and circuit board that extend past the outside edges of the light-emitting unit/substrate.
Figure 5B:
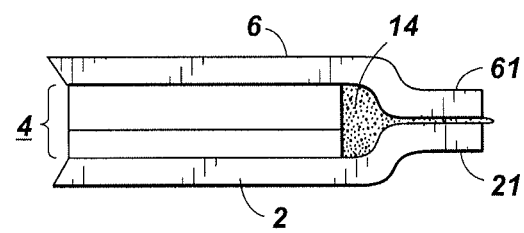
FIG. 5B shows the use of adhesive.
Figure 5C:
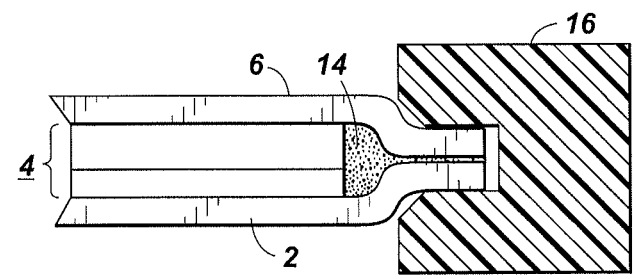
FIG. 5C shows an attaching mechanism.

The embodiments shown in FIGS. 1-4 have a light management unit 2 on the emitting face of the device that is larger in the length and width dimensions than the underlying OLED unit/substrate 4. On the non-emissive face of the panel, there is a circuit board 6 that is also larger in the length and width dimensions, and thus the area, of the overlying OLED unit/substrate 4. This is illustrated in the cross-sectional view of a lighting panel edge in FIG. 5A. Thus, there are overhanging portions 21 of the light management unit 2 and portions 61 of the circuit board 6 that extend past the outside edges of the OLED unit/substrate 4 and are not in direct contact in the OLED unit/substrate 4. Note that since both the light management unit 2 and the circuit board 6 are flexible, these layers may naturally come together wherever not separated by the OLED unit/substrate 4. These overhanging portions may be connected together with adhesive 14 as in FIG. 5B. The extending portions 21 and 61 help to protect the edges of the OLED unit/substrate 4. In addition, these extending portions may be used to attach the panel into a lighting module or luminaire without having to directly attach the OLED unit/substrate, as shown in FIG. 5C. This allows for a very thin attaching part 16 since the OLED unit/substrate 4 does not have to fit under or into the attaching part 16. This also helps to prevent buckling of the OLED panel during operation due to thermal expansion since the OLED unit/substrate 4 is not attached directly to the attaching part 16, but only by the extending portions of layers above (61) and below (21) the OLED unit/substrate 4. This way of attachment allows for some freedom of movement of the OLED unit/substrate 4 but yet securely fastens the outside edges of the panel. In addition, the presence of the light management unit 2 on the front (emissive) face and the circuit board 6 on the back (non-emissive) face of the panel increases safety in case the substrate, which can comprise a material such as glass, is broken, as well as increases flammability resistance. The overlapping portions can also provide protection to the edge of the OLED substrate. The overhanging portions of 21 and 61 may also be joined together by mechanical means such as clamps or by pressure applied by the attaching part 16.

However, other applications may not need these overlapping portions of the light management unit or even the light management unit itself. The presence of the light management unit is optional. In cases where a light management unit is used but there is no need to have portions extending out from the edges of the OLED unit/substrate, the light management unit only needs to be large enough to completely cover the emissive part of the OLED unit. Thus, the light management unit should be equal or larger in area than the emissive area, but can be the same, smaller or larger in area than the OLED substrate. It is desirable that when present, the light management unit is the same or greater in area than the OLED substrate and the main body of circuit board.

Figure 6:
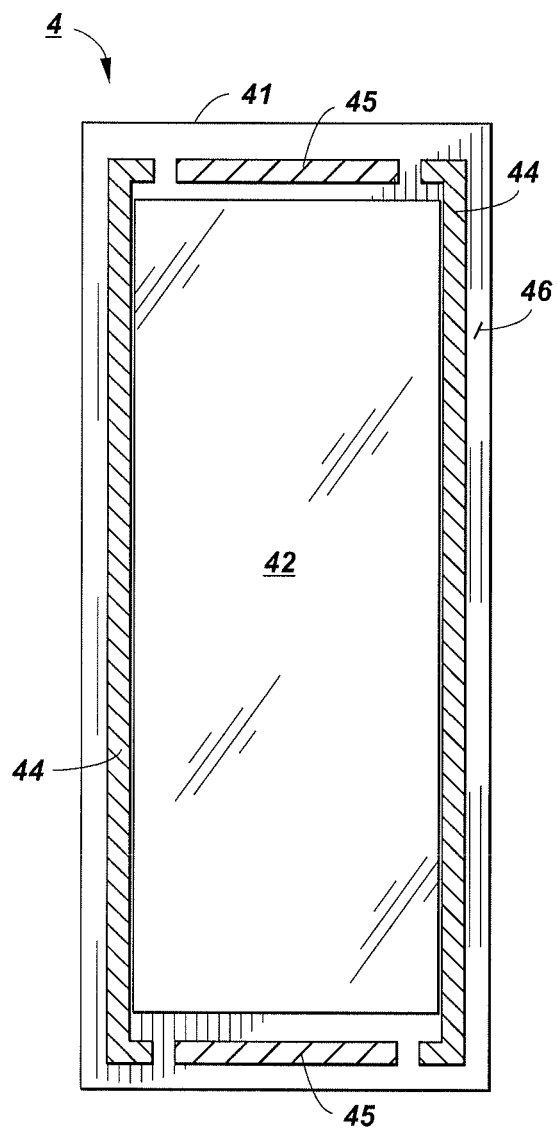
FIG. 6 is an overhead view of a light-emitting unit on a flexible substrate.

FIG. 6 shows further details of the flexible light-emitting unit/substrate 4. The view in FIG. 6 is of the non-emitting face of the light-emitting unit/substrate 4. A light-emitting unit 42 is deposited on a flexible substrate 41 which has an outside edge 46. The length and width of the light-emitting unit 42 are both less than the length and width of the flexible substrate 41 so that it lies entirely within the outside edges 46. Light emitted from the light-emitting unit passes through the transparent flexible substrate 41. The areas outside the light-emitting unit 42 are non-emitting. In this embodiment, the non-emitting area completely surrounds the emission area on all sides. The contact pads 44 and 45 for the light-light emitting unit are located in this area of the non-emitting face. In the embodiment of FIG. 6, there are 2 contact pads (44) connected to one of the internal electrodes of the light-emitting unit on both of the long edges of the light-emitting unit and extending partly along the short edges, and two contact pads (45) connected to the other internal electrode on both of the short edges. The two types of contact pads are separated from each other in order to prevent short-circuits. However, the layout and number of the contact pads may be selected as desired and is not limited to this orientation. For example, there could be one contact pad along one edge of the light-emitting unit with the other contact pad on the other 3 edges or 2 contact pads of opposite polarity along each of the 4 edges on the light-emitting unit, where each contact pad runs along only half the length of the edge.

Figure 7A:
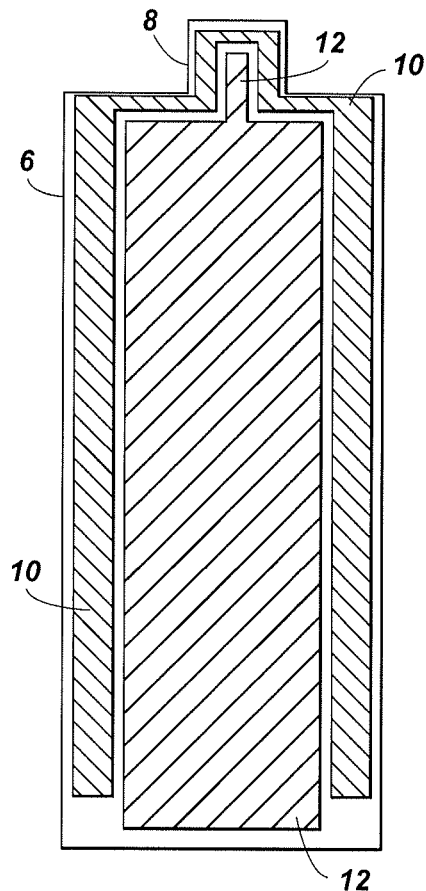
FIG. 7A is an overhead view of the flexible printed circuit board showing one layout of the flat electrical connectors.

FIG. 7A shows further details of the flat flexible printed circuit board 6 showing one embodiment for the positioning of the flat electrical connectors 10 and 12. The view of FIG. 7A is of the side of the circuit board that will eventually face the light-emitting unit/substrate 4 which is shown in FIG. 6. Flat electrical connector 12 covers most of the surface of the circuit board 6 and is positioned (when assembled to the non-emitting face of 4 as shown in FIG. 6) so that it can make electrical contact to the two contact pads 45 on the short ends of the substrate 41 but does not overlap or make electrical contact to the other two contact pads 44 on the long ends of the substrate 41. Flat electrical connector 12 also has a narrow portion that extends along the extension tab 8. Flat electrical connector 10 runs along the sides of the other connector 12 and is positioned (when assembled) so that it can make electrical contact to the two contact pads 44 on the long ends of the substrate 41 but does not overlap or make electrical contact to the other two contact pads 45 on the short ends of the substrate 41. Flat electrical connector 10 also has two interconnected portions that extend along the outside edges of the extension tab 8 that surround, but do not contact, the extension of connector 12.

Figure 7B:
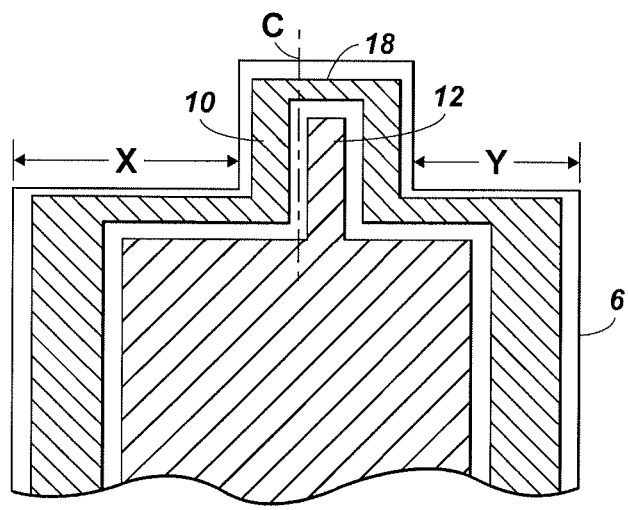
FIG. 7B is an overhead enlarged view of the extension tab area of FIG. 7A showing the placement of the flat connectors.

An enlargement of the extension tab 8 section from FIG. 7A is shown in FIG. 7B. Because this connector layout requires connector 10 to run along both long edges of the circuit board 6, there is an interconnecting bridge 18 that allows power to flow to both edges. This allows external electrical connection to connector 10 to be made on one side of tab 8 only and avoids the need to cross one connector over the other. In order to center the external connectors on the panel, the midpoint of the panel (indicated by the dotted line) should fall between one side of the connector 10 and connector 12. In order to achieve this, it is necessary that the extension tab 8 is not centered on the edge of the panel but is offset from the centerline (indicated by dashed line) of the panel (distance X>distance Y).

Figure 8:
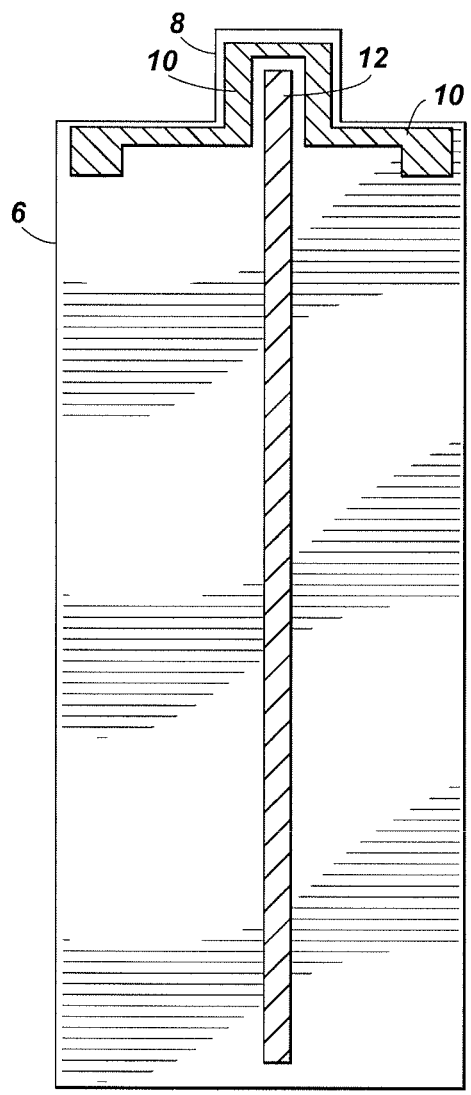
FIG. 8 is an overhead view of another layout for the flat electrical connectors.

FIG. 8 shows another embodiment, different from that shown in FIG. 7A, for the positioning of the flat electrical connectors 10 and 12 on circuit board 6. In this embodiment, flat electrical connector 12 is a long strip which makes electrical contact with both parts of contact pads 45 (when placed face-to-face with the contact pad layout as shown in FIG. 8) while flat electrical connector 10 covers only part of both contact pads 44 and does not extend along the long edges of the circuit board 6.

Figure 9:
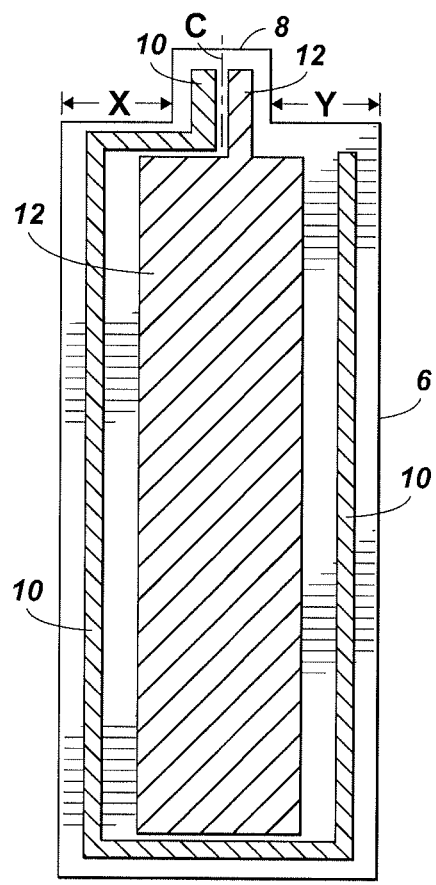
FIG. 9 is an overhead view of another layout for the flat electrical connectors.

Yet another embodiment for the layout of the flat electrical connectors 10, 12 on circuit board 6 is shown in FIG. 9. In this embodiment, electrical connector 10 is a single long strip that runs parallel along the outside edge of the circuit board 6 while electrical connector 12 fills most of the interior space within electrical connector 10. In this embodiment, the extension tab 8 may be centered at the midpoint of the edge of the circuit board 6 as indicated by the dashed line (distance X=distance Y). When placed face-to-face with the contact pad layout as shown in FIG. 6, flat connector 10 will contact both of contact pads 44 while flat connector 12 will contact both contact pads 45.

In some embodiments, it may be desirable to have one of the flat electrical connectors cross-over the other without making electrical contact between them. In these situations, it may be necessary to use an electrically insulating layer between them in order to prevent short-circuits.

Figure 10:
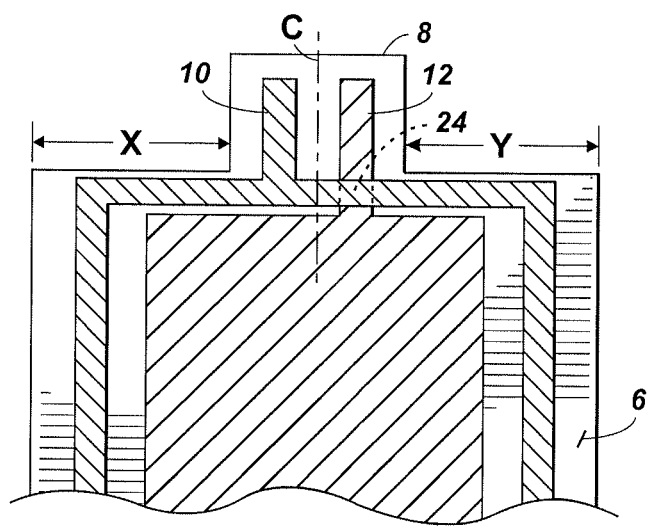
FIG. 10 shows a layout for the flat electrical connectors where one crosses-over the other without electrical contact.

FIG. 10 shows an example of where the flat electrical connectors 10, 12 cross-over each other without making contact. In this embodiment, flat connector 12 extends from the extension tab 8 to the interior of the circuit board 6 to be in contact with pads 45 (when assembled with substrate 41 as shown in FIG. 6). Flat connector 10, which still must contact pads 44 along the long edges of the substrate 41, has a bridge region 24 which passes over flat electrical connector 12. In the bridge region 24, there is no contact between flat electrical connectors 10 and 12 which can be separated by an insulating layer (not shown). In this embodiment, only a single section of each flat connector 10 and 12 is needed to be located on the extension tab 8 and so extension tab 8 may be centered at the midpoint of the edge of the circuit board 6 as indicated by the dashed line (distance X=distance Y).

In all of the above embodiments, the flat electrical connectors 10 and 12 should never be in direct electrical contact with each other. The electrical contact between the flat electrical connectors 10 and 12 of the circuit board 6 to the contact pads 44 and 45 on the substrate 41 may be direct when the non-emissive face of substrate 41 and the face of the circuit board 6 with the electrical connectors 10 and 12 are assembled face-to-face. Alternatively, electrically conductive glue or adhesive, appropriately sized and shaped ACF (anisotropic conductive film) or additional electrical connectors such as 91 and 92 as shown in FIG. 2A may be used to make electrical contact between them.

It is desirable that the flat electrical connector 12 and contact pads 45 are connected to the cathode of the light-emitting unit. The flat electrical connector 10 and contact pads 44 are desirably connected to the anode of the light-emitting unit. Although these Figures show particular layouts for the flat electrical connectors on the circuit board and contact pads on the substrate for illustration, the layouts can be adjusted as appropriate.

The lighting panel is suitable for general lighting applications. It may be suitably modified for use in specific applications. For example, it may be fitted with a lens to concentrate the emitted light in order to act as highlighting or it may be fitted with filters to adjust the color temperature of the emitted light. It may be directly used as part of a specific luminaire design or may be used as the light source in a lighting module which can be used interchangeably between different luminaire designs.

The lighting panel has at least one light-emissive face or surface. The opposite face or surface of the panel can be non-emitting so that the panel has single sided emission. The opposite face or surface can also be light-emitting so that the panel has dual sided emission. In this case, the circuit board should be transparent and the flat electrical connectors are as small as possible. The lighting panel can be transparent or translucent if desired. The light-emitting surface(s) can have emissive areas and non-emissive areas. Desirably, the non-emissive areas will surround a single emissive area and have a total non-emissive area less than the emissive area. It is most desirable that the panel has single sided emission where the non-emissive areas around the emissive area are as small as possible.

The flexible light management unit serves a number of purposes and may be composed of multiple layers. Its primary purpose is to increase the amount of light scatter of the light being transmitted through the substrate, thus improving light distribution from the device and improving overall efficiency. Generally, the flexible light management unit will have a light scattering medium located either on the surface or within a flexible polymeric or glass substrate or the flexible substrate will contain physical structures (for examples, bumps or projections of various shapes) that cause light scattering. In some cases, the flexible light management unit may be part of the same flexible substrate as the light-emitting/substrate unit. In other cases, it may be a separate unit in the form of a thin film that is applied to the light-emitting surface of the light-emitting unit/substrate using an optically clear adhesive. In addition to its light management function, it will also help to protect the surface of the device from damage. In embodiments where the light management unit is larger in area than the substrate so there is a portion that overhangs the substrate, the overhanging portions may be used to attach the device to a mounting or surface. Moreover, the overhanging portion will help to protect the edge of the substrate, particularly flexible glass substrates.

The light emitting unit/substrate refers to a complete light-emitting unit located on a substrate. A complete light-emitting unit will have a first electrode, electroluminescent layer(s), second electrode, all fully covered by encapsulation to prevent contact with air and water. Desirably, the light-emitting unit is an OLED unit where the electroluminescent layers are organic.

The substrate is flexible and can be made of flexible glass, metal or polymeric materials. Flexible glass is most desired. Generally speaking, it will be flat with a uniform thickness. In some cases, it may be necessary to provide features in the substrate in order to increase flexibility. If the substrate is flexible glass, the glass edge may be thermally treated to remove any surface defects. Defects such as nicks or defects in the glass edge can be the origin or starting points for glass breakage under stress. Heat treatment can prevent this by removing any defects and so, increase effective bendability without breaking. For bottom emitting devices, the substrate should be transparent. For top emitting devices, the substrate may be opaque or transparent (allowing for two-sided emission) as desired. The top surface of the substrate is that facing the light-emitting unit. Since the substrate will be part of the overall encapsulation for the device, it should be sufficiently impervious to air and water so that the device will have desired lifetime. The substrate may have various types of subbing or barrier layers which may be patterned or unpatterned and can be either on the top or bottom surfaces.

In the light-emitting unit, there is a first electrode that covers the top surface of the substrate and desirably completely covers the top surface of the substrate. The first electrode can be an anode or a cathode and can be transparent, opaque or semi-transparent. Desirably, the first electrode is a transparent anode and the device is a bottom emitter. The transparent first electrode should transmit as much light as possible, preferably having a transmittance of at least 70% or more desirably at least 80%. However, in some applications (i.e. microcavity devices), the transparent first electrode may only be semi-transparent and have partial reflectivity. While the first transparent electrode may be made of any conductive materials, metal oxides such as ITO or AZO or thin layers of metals such as Ag are preferable. In some cases, there may be an auxiliary electrode to help distribute charge more uniformly across the full plane of the transparent electrode.

For embodiments where the light-emitting unit is an OLED, organic layers for light-emission will be deposited and will be in contact with the first electrode. At least one organic layer will be electroluminescent. There may be more than one layer and some layers may not be light-emissive. Formulations and layers appropriate for OLED type light emission are well known and can be used as desired. The organic layers may be small molecule or polymeric. The organic layers may be deposited by any known method including vapor deposition, solution coating, ink-jet techniques, spraying and the like. The organic layers may be patterned. Inorganic electroluminescent materials such as quantum dots could also be used for light emission. Because such formulations also include organic materials, the use of inorganic electroluminescent materials can be considered as an OLED for the purpose of the invention.

Over the organic layers, there is a second electrode. It may be an anode or a cathode; preferably a cathode. The second electrode may be transparent or opaque, preferably opaque. If transparent, it is desirably composed of conductive transparent metal oxides such as ITO or thin layers of metals such as Ag. If opaque, it is desirably composed of a thicker layer of metal or metal alloy such as Al, Ag, Mg/Al, Mg/Ag and the like. The second electrode may be deposited by any known technique.

Over the second electrode, there may optionally be a protective organic layer, protective inorganic layer, or a combination of both. This is to prevent damage to the second electrode and underlying organic layers during encapsulation.

The light-emitting unit is fully encapsulated. The encapsulation is provided on one surface by the substrate. The sides and top of the light-emitting unit can be encapsulated by a flexible impervious cover that is affixed to the substrate to seal the unit. Most desirably, the encapsulation of the sides and top of the unit is provided by thin-film encapsulation. Thin-film encapsulation typically includes multiple (for example, 3 or more) alternating layers of inorganic and organic materials. Alternatively, thin-film encapsulation may comprise an adhesive layer with embedded moisture absorbing getter particles with an impermeable barrier layer or film, such as a thin metal foil or a plastic barrier film. There are electrically conductive extensions of the first and second electrodes that will extend through the encapsulation and form contact pads for external electrical connection. Since the substrate is part of the encapsulation, it may be necessary to add additional thin-film encapsulation such as barrier layers on either side of the substrate to provide additional protection. The additional barrier layer(s) may be the same as that applied over the light-emitting unit or made of different materials.

Over the light-emitting unit/substrate, there can be optional adhesive materials and/or protective layers to fasten the light-emitting unit/substrate to the overlying circuit board. These materials should be flexible. Examples of suitable adhesive materials would be double sided adhesive tape or liquid adhesive, which may be applied by spraying, brushing, rolling, lamination or similar methods. There may also be metal foil present to help serve as a heat sink as well to prevent damage to the OLED unit during manufacture. Inorganic or polymeric layers may also be used as protective layers. The metal foil or other protective layers may be present between adhesive layers. If the protective layers are electrically conductive, they must be arranged not to come into contact with either the contact pads of the light-emitting unit or the flat electrical connectors of the circuit board or any connectors between the two. If the panel has two-sided emission, the adhesive and/or protective layers should be translucent or transparent.

Over the light-emitting unit/substrate and optional adhesive materials and/or protective layers, there is a flexible printed circuit board. Desirably, the main body (not including the tab) of the circuit board has the same or greater area than the emissive area of the light-emitting unit, even though it is located on the non-emissive face of the substrate. In this way, the circuit board can provide protection against damage to the underlying unit as well as acting as a heat sink. Moreover, the circuit board (not including the tab) can completely overlap and could have the same or greater area that the substrate. In embodiments where the circuit board (excluding the tab) is larger in area than the substrate so that there is a portion (in addition to the tab) that overhangs the substrate, the overhanging portions may be used to attach the device to a mounting or surface. Moreover, the overhanging edges may protect the edge of the substrate. If the panel has two-sided emission, the circuit board should be translucent or transparent. In embodiments where the circuit board is smaller in area than the emissive area of the OLED, it can be located along anywhere on the surface or side of the OLED substrate. It may also form a frame around the outside edge of the OLED substrate, and may or may not overhang the OLED substrate.

The substrate or carrier of the flexible printed circuit board is made of non-electrically conductive plastic or polymeric materials. It may be composed of two or more layers and these layers can be made of different materials. At a minimum, it has at least two flat electrical connectors on one surface of the circuit board that run out along an extension tab. There may be other electrical control (such as transistors) or power (such as resistors) related features on either surface of the circuit board or on the extension tab.

One advantage of locating the flat electrical connectors on a flexible extension tab that can be bent or folded is that the flat wires can be made very thin and still be bent without breaking or cracking. Moreover, the tab can be manipulated much easier and robustly than free wires. Finally, the tab holds the flat electrical connectors in fixed positions which makes external electrical attachment much easier and more reliable since the connectors would not be prone to move out of position during assembly or handling. For ease of external electrical connection, it is desirable that the two flat electrical connectors on the tab should each have an area of at least 5 mm×5 mm. Alternatively, additional conductive contact or solder pads (i.e. pads 11 in FIG. 1A) may be electrical connected to the flat electrical connectors. The use of such pads, which can be thicker than the flat electrical connectors, increases the physical robustness when connecting to an external power source. For example, they can be made from copper coated with SnAg and can be connected by solder, ACF, or a conductive adhesive to the flat electrical connector.

The flat electrical connections on the flexible printed circuit board are made of electrically conductive metals such as Al, Cu, Sn and are thin. They should have sufficient flexibility to be able to bend with the extension tab without breaking. The surface of the circuit board with the flat electrical connectors faces the adhesive materials and/or protective layers (if present) and the OLED unit. Since the flat electrical connectors may be bent along with the extension tab in some embodiments, the flat electrical connectors may contain stress-relieving features that allow the bending without cracking or breaking. There may be adhesive between the flat electrical connectors and the circuit board. In addition, the flat connectors may lie within channels or hollowed-out spaces on the polymeric substrate of the circuit board so that the surface of the circuit board is level.

Desirably, the circuit board should be 0.2 mm or less in maximum overall thickness; the thickness of the polymeric substrate should be 0.1 mm or less; the thickness of the flat electrical connectors should be 0.09 mm or less and the thickness of any adhesive between the flat connectors and the plastic substrate should be 0.01 mm or less.

One advantage of having the flat electrical connectors cover most of the surface of the circuit board is that since they are metallic, they can serve as a heat sink in addition to supplying power to the OLED unit. For example, see EP2993713, US2010148665 and US2001/033135. Moreover, having a high degree of coverage by metal provides additional protection to the underlying OLED unit and its encapsulation. The flat electrical connectors together should cover at least 1% or more, desirably, 6% or more, of the surface area of the circuit board. One flat electrical connector may be larger than the other. In such cases, it is desirable that the smaller one cover at least 1% of the surface while the larger covers at least 5%. In some embodiments, the coverage by the electrical connectors should at least more than the emissive area of the lighting panel. In these embodiments, the total coverage is desirably at least 65% or more, or most desirably, at least 80% or more of the circuit board.

The extension tab on the flexible printed circuit board may be made of the same material as the main body of the circuit board or made of a different material. The main body of the circuit board and the extension tab may be one piece or two separate pieces. If separate pieces, there is a flexible joint between the two. For example, the extension tab may be attached to the main body of the circuit board by flexible adhesive tape. In such embodiments, the flat electrical conductors should run continuously over the joint. It is most desirable that the flexible printed circuit board has an integral bendable extension tab; that is, the circuit board and extension tab form one continuous unit of the same material. The extension tab (when unbent as in FIGS. 1-2) is not located over the emissive area of the light-emitting unit. The extension tab may be run along the entire edge of the circuit board, but more desirably, is less than the width of the edge. This is to minimize the region where the overall thickness of the panel is thicker whenever the extension tab is folded back upon itself. Moreover, it is easier to uniformly bend a smaller tab compared to a tab that would run the full length of the circuit board. Finally, a wide tab would require the user to design a wider connection area or wire way. On the other hand, a certain width of the tab should increase the robustness against twisting and thereby damaging the connectors on the tab. Desirably, the width of the tab should be at least 5% of the width of the circuit board edge but less than 80% of the width.

There may be more than one extension tab on a panel and one extension tab may be electrically connected to the extension tab of another panel to allow easy interconnection between panels. In some examples, there may even be two or more extension tabs along a single edge. It is most desired to have one extension tab per device, preferably on the short edge of a rectangular panel.

The extension tab can be bent so that the flat electrical connections on the extension tab become accessible in different orientations. There are three modes of operation: a first mode where the extension tab is not significantly bent so that the flat electrical connectors are accessible on the same face as the light-emitting unit and orientated in the same direction of emission of the panel (see FIGS. 1-2), a second mode where the extension tab is partly bent and orientated so that the flat electrical connectors are accessible along the edge of the panel (see FIG. 3), and a third mode where the bendable extension tab is fully folded back upon the circuit board so the flat electrical connectors are accessible along the non-emissive face of the panel as well as the edge of the panel (see FIG. 4). This allows for a single panel that can be used in different wiring designs.

The extension tab is commonly bent or folded along the edge of the main body of the circuit board. However, in some embodiments, the point at which the extension tab is bent may lie at some distance away from the edge of the main body so that when the extension tab is bent, there remains some unbent portion of the extension tab of the circuit board.

In those embodiments where the extension tab is to be bent, the joint region between the circuit board and the extension tab must have sufficient flexibility to allow the tab to reach the desired angle without breaking or cracking. Thus, the joint region may have stress-reducing features or designs that locally increase flexibility. For example, the joint region between the main body and the extension tab may be thinner than either part. Alternatively, the joint region may have accordion-like structures that relieve the stress from bending.

In some bent orientations of the extension tab, it may be necessary to use an adhesive or a supporting structure to help hold the bent portion in the desired position. For example, in the configuration shown in FIG. 4 where the extension tab is folded completely back upon itself, there may be an adhesive (for example, double-sided adhesive tape) between the back of the extension tab (or optional stiffener) and the back of the circuit board.

In some embodiments, a stiffener (i.e. 13 in FIGS. 1B, 2A and 2B) can be attached to the backside (opposite to the surface to be attached to the OLED light-emitting unit/substrate 4) of the extension tab toward the end. This can make it easier to bend the tab in a reliable fashion. Suitably, it can be a piece of biaxially orientated PET such as Mylar and attached with double sided adhesive tape.

The overall length of the extension tab can be selected as desired. In some cases, the extension tab can be cut or trimmed to a selected length after bending to the desired orientation. For example, the extension tab 8 in FIG. 3B is bent at a 90° angle; however, the end of the extension tab is above the plane of the circuit board 6. This portion can be trimmed off if desired. The extension tab may contain structural features to enable cutting or trimming. Desirably, the ratio of the length of the extension tab to the length of the main body of the circuit board is at least 1:100 but less than 1:2, preferably in the range of 1:50 to 1:10.

In some embodiments, the extension tab along with the flat electrical connections can be covered (all or in part) with a non-conductive material. This may be to protect the flat electrical connectors and/or associated contact pads from incidental contact. Alternatively, the covering may be to hide or protect the electrical connections when not in use.

For flexible panels, the panel should be bendable down to a radius of at least 100 mm.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

C tab centerline, short and long dashed line
X distance on left side of tab 8
Y distance on right side of tab 8
2 flexible light management unit
4 light-emitting unit/substrate
6 flexible circuit board
7 optional adhesive layer
8 bendable extension tab with conductive lines
10 electrical connection line
11 optional pads for electrical connection to external power source
12 electrical connection line
13 optional stiffener
14 adhesive
16 attaching part
18 interconnecting bridge
20 flat electrical contact bent 90 degrees
21 extended/overhanging portions of light management unit
22 second flat electrical contact bent 90 degrees
24 crossover region
26 side edge of circuit board
28 bent 90 degrees extension tab
30 folded over electrical contact
32 second folded over electrical contact
36 side edge of circuit board
38 folded over extension tab
41 transparent substrate
42 OLED light-emitting unit
43 encapsulation layer
44 contact pad
45 contact pad
46 first electrode
47 organic layer(s)
48 second electrode
61 extended/overhanging portions of circuit board
91 electrical connector
92 electrical connector
100 lighting panel with unbent extension tab
200 lighting panel with 90 degree bent extension tab
300 lighting panel with folded over extension tab

The invention claimed is:

1. A flexible lighting panel with an emissive face and an opposite face comprising:
    a light-emitting unit comprising at least one electroluminescent layer between a first and a second electrode on a flexible substrate forming an emissive area, the light emitting unit having at least two electrical contact pads, each individually in contact with the first or second electrode and located in a non-emissive area of the substrate,
    a one flat flexible printed circuit board with at least one bendable extension tab, wherein the circuit board is located on the opposite side of the light-emitting unit from the substrate; the area of the circuit board, not including the extension tab, is the same or greater than and overlaps the emissive area of the light-emitting unit; and
    the circuit board has at least two flat electrical connectors on the surface of the circuit board facing the light-emitting unit and in electrical contact with the contact pads of the light-emitting unit; the flat electrical connectors extending along the extension tab of the circuit board for connection to a power source.

2. The flexible lighting panel of claim 1 where the extension tab is partly bent and orientated so that the flat electrical connectors are accessible along the edge of the panel.

3. The flexible lighting panel of claim 1 where the bendable extension tab is fully folded back upon the circuit board so the flat electrical connectors are accessible along the opposite face of the panel as well as the edge of the panel.

4. The flexible lighting panel of claim 1 where the bendable extension tab is less in width than the edge of the circuit board.

5. The flexible lighting panel of claim 1 where the area covered by the flat electrical connectors is at least 65% or more or the area of the circuit board.

6. The flexible lighting panel of claim 1 where the flat electrical connectors on the bendable extension tab are patterned such that a single portion of one of the flat electrical connectors is located between two interconnected portions of the other flat electrical connector.

7. The flexible lighting panel of claim 6 where the extension tab is located along the edge of the panel such that center of the space between the single portion of one flat connector and one of the interconnected portions of the other flat connector lies along the midpoint of the edge of the panel.

8. The flexible lighting panel of claim 1 where the circuit board is larger in area than the substrate so part of the circuit board overhangs the outside edge of the substrate.

9. The flexible lighting panel of claim 1 which comprises a flexible light management unit on the emissive face of the flexible lighting panel which completely covers and is the same or greater in area than the emissive area.

10. The flexible lighting panel of claim 9 where the flexible light management unit is larger in area than the substrate so part of the light management unit overhangs the outside edge of the substrate.

11. The flexible lighting panel of claim 10 where the circuit board is larger in area than the substrate so part of the circuit board overhangs the outside edge of the substrate.

12. The flexible lighting panel of claim 11 where the overhanging parts of the light management unit and the circuit board are joined together by adhesive or mechanical force.

13. The flexible lighting panel of claim 1 where the substrate is transparent so that light from the light-emitting unit is emitted through the substrate.

14. The flexible lighting panel of claim 1 where the flexible printed circuit board comprises a plastic or polymer carrier with an overall thickness of no more than 0.2 mm.

15. The flexible lighting panel of claim 1 where the light-emitting unit is an OLED.

* * * * *